United States Patent
Larson et al.

(10) Patent No.: US 7,726,144 B2
(45) Date of Patent: Jun. 1, 2010

(54) THERMAL MANAGEMENT USING STORED FIELD REPLACEABLE UNIT THERMAL INFORMATION

(75) Inventors: Thane M. Larson, Roseville, CA (US); Christopher G. Malone, Loomis, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1155 days.

(21) Appl. No.: 11/259,289

(22) Filed: Oct. 25, 2005

(65) Prior Publication Data

US 2007/0089446 A1    Apr. 26, 2007

(51) Int. Cl.
*F25D 23/12*    (2006.01)
*F28F 9/26*    (2006.01)
*F24H 3/00*    (2006.01)
*G06F 15/00*    (2006.01)
*G06F 7/60*    (2006.01)

(52) U.S. Cl. ............... 62/259.2; 165/80.3; 165/104.33; 702/130; 702/132; 703/2

(58) Field of Classification Search ............... 62/259.2, 62/263; 165/80.3, 104.33; 702/130, 132, 702/62; 703/1, 2, 7; 361/695
See application file for complete search history.

(56) References Cited

U.S. PATENT DOCUMENTS

| | | |
|---|---|---|
| 6,280,317 B1 | 8/2001 | Przilas et al. |
| 6,467,696 B2 | 10/2002 | Riley et al. |
| 6,481,635 B2 | 11/2002 | Rilet et al. |
| 6,718,277 B2 * | 4/2004 | Sharma ............... 702/132 |
| 2002/0072868 A1 | 6/2002 | Bartone et al. |
| 2003/0147214 A1 | 8/2003 | Patel et al. |
| 2004/0078153 A1 | 4/2004 | Bartone et al. |
| 2004/0178269 A1 * | 9/2004 | Pradhan et al. ......... 235/462.13 |
| 2004/0186599 A1 | 9/2004 | Ahmed et al. |
| 2004/0203377 A1 * | 10/2004 | Eaton et al. ................. 455/41.2 |
| 2007/0174024 A1 * | 7/2007 | Rasmussen et al. ............. 703/1 |

* cited by examiner

*Primary Examiner*—Chen-Wen Jiang

(57) ABSTRACT

A method of managing conditions in a data center comprises storing information relating to field replaceable unit thermal properties in at least one field replaceable unit non-volatile memory and generating information for real-time dynamic temperature mapping of the data center based on the field replaceable unit thermal property information.

18 Claims, 13 Drawing Sheets

THERMAL MANAGEMENT USING STORED FIELD REPLACEABLE UNIT THERMAL INFORMATION

BACKGROUND OF THE INVENTION

Data center managers and customers face a growing challenge managing the cooling and electrical specifications of information technology (IT) equipment deployed in data centers. The amount of power and system-level airflow for suitable operation and performance has dramatically increased over the past decade due to exponential increases in device performance concurrent with similarly remarkable reductions in system sizes and form factors. Nameplate power information on servers is defined as a maximum value specified for regulatory compliance and, accordingly, is much higher than actual power consumption. Typically, manufacturers do not supply system-level airflow specifications and, if specified, only a single maximum airflow requirement is defined in technical documentation that is not readily available to most customers. The maximum airflow specification is usually included only on labels or in documentation and merely identifies a qualified, ambient temperature range of the product. Although the temperature specifications may also be tested manually for site planning, such usage is tedious to accomplish, particular when specified on multiple possibly diverse systems, components, and devices, each with different usage and diverse requirements.

SUMMARY

In accordance with an embodiment of data center management system, a method of managing conditions in a data center comprises storing information relating to field replaceable unit thermal properties in at least one field replaceable unit non-volatile memory and generating information for real-time dynamic temperature mapping of the data center based on the field replaceable unit thermal property information.

BRIEF DESCRIPTION OF THE DRAWINGS

Embodiments of the invention relating to both structure and method of operation may best be understood by referring to the following description and accompanying drawings.

DETAILED DESCRIPTION

Thermal properties characterizing a field replaceable unit (FRU) may be encoded and stored for usage in electronically and/or automatically managing thermal and power conditions in a data center.

In some embodiments, one or more sensors may be distributed in the data center, possibly including sensors associated with a field replaceable unit (FRU), to measure parameters used in combination with the encoded thermal properties, enhancing management of thermal and power conditions in the data center.

A thermal control apparatus combines data center and thermal/power management and control, enabling optimization of thermal and/or power management and averting possible pending component failures.

Figure 1B:
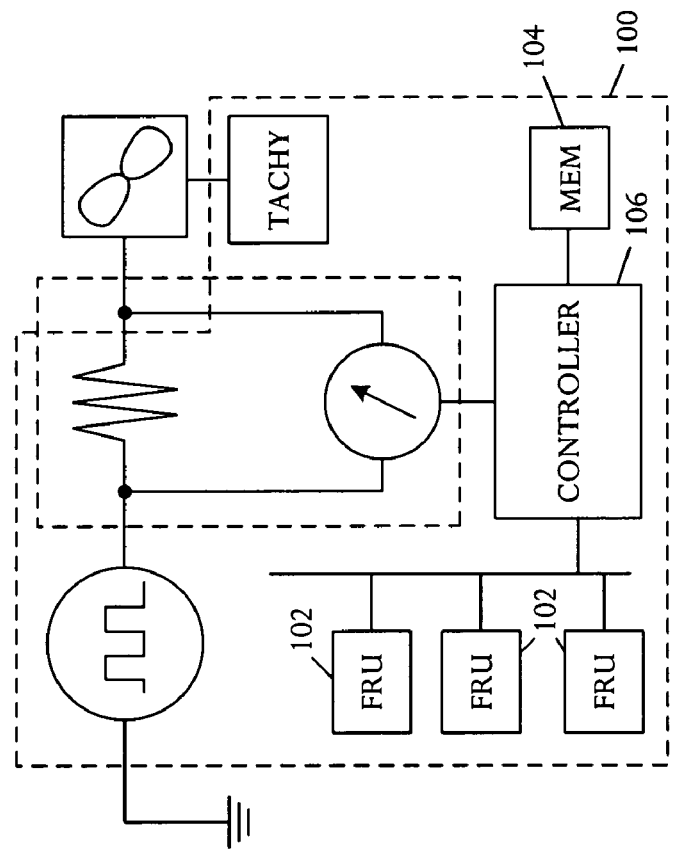
FIGS. 1A, 1B, and 1C are schematic block diagrams depicting embodiments of a thermal management apparatus adapted for controlling data center temperature.
Figure 1A:
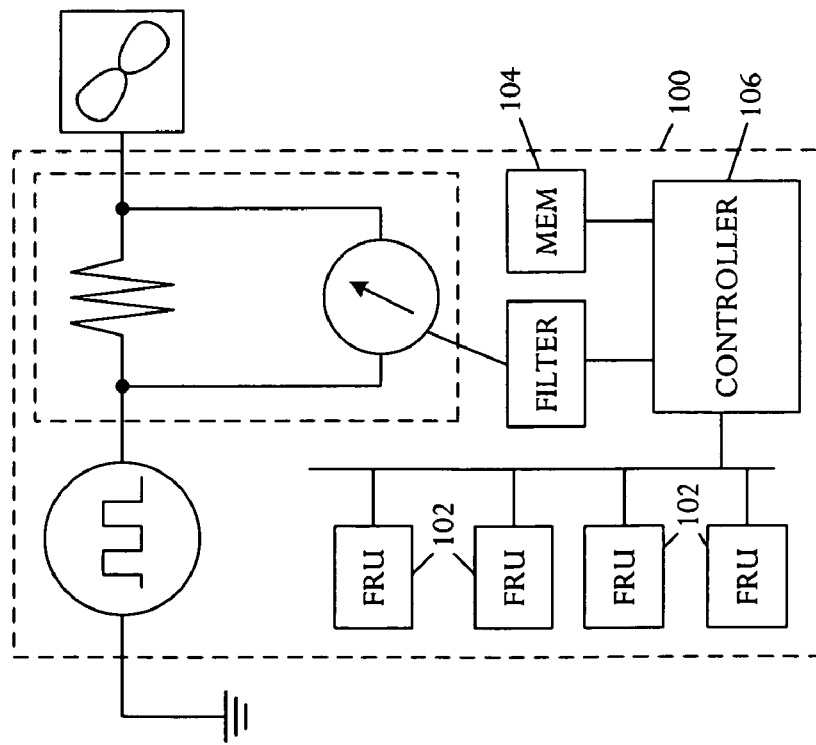
Figure 1C:
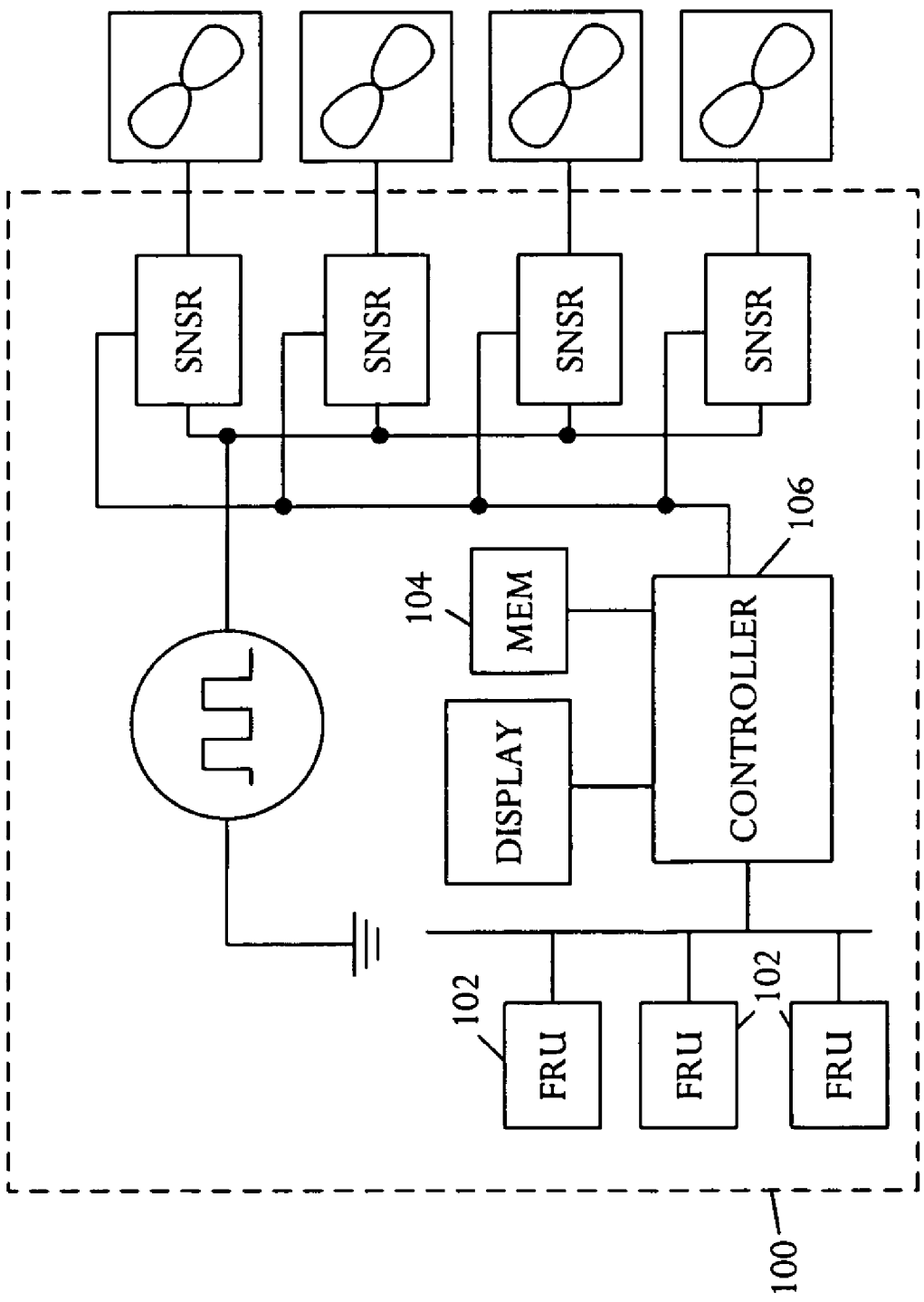

Referring to FIGS. 1A, 1B, and 1C, schematic block diagrams illustrate embodiments of a thermal management apparatus 100 adapted for controlling data center temperature. The thermal management apparatus 100 includes one or more field replaceable units (FRUs) 102 comprising a non-volatile memory 104 that stores information relating to thermal properties of the field replaceable and a controller 106. The controller 106 is coupled to a field replaceable unit 102 which is adapted to generate information for real-time dynamic temperature mapping of the data center based at least partly on the stored field replaceable unit thermal properties.

In preparation for managing conditions in the data center, information is stored relating to field replaceable unit thermal and/or power properties in the non-volatile memory 104 such as an electrically erasable programmable read-only memory (FRU EEPROM) for the field replaceable units 102. The controller 106 is programmed to generate information enabling real-time dynamic temperature mapping of the data center based on the field replaceable unit thermal property information. The FRU EEPROMs may be used to track serial numbers and similar system-specific information. Some EEPROM fields may be used to label FRU power usage. For example, Intelligent Platform Management Interface (IPMI) specifies operational criteria for monitoring system physical health characteristics such as voltages, fans, temperature, power supplies, and board insertions. IPMI supports automatic alerting with remote system shutdown and restarting, as well as maintenance of an alert remote log. The illustrative FRU EEPROM may be further enhanced to add fields that characterize thermal properties of the field replaceable unit (FRU) 102 including, for example, air-flow, temperature rise across the FRU, component and/or package size, and the like.

A field replaceable unit 102 may be any device, component, or element in the data center, including any item that can be plugged into a rack, such as processors, memory, disks, any application components, and others. Furthermore, the rack into which items are plugged may be configured as a field replaceable unit 102. Accordingly, a field replaceable unit 102 may be a box or rack that holds multiple other field replaceable units 102 so that memories 104 may store layers of FRU information or tags. In any case, the field replaceable unit 102 is configured with a memory 104 to store information relating to FRU operations and characteristics, including thermal and power conditions.

In a specific example of a configuration with layers of FRU information tags, an electronic device may include a chassis, a processor, a memory module, and a disk drive, all of which are field replaceable units 102 and each having a memory 104 adapted to store thermal and power information. Each of the processor, memory module, and disk drive are contained within the chassis. The chassis is a field replaceable unit 102 with a memory 104 containing fields for storing thermal and power information that may be a composite or aggregation of the thermal and power information specified in the memories of the processor, the memory module, and the disk drive.

In various implementations and/or conditions, the non-volatile memory 104 may store various types of information relating to field replaceable unit thermal and/or power properties including one or more properties selected from airflow, absolute temperature, temperature rise across the field replaceable unit, package size, and others. Airflow specifications may include designations in velocity for example in meters per second and/or volumetric flow rate such as in cubic meters per second. In some embodiments, the non-volatile memory 104 may store multiple values for different aspects of a particular parameter, such as maximum, minimum, and average operating values of the parameter.

In various embodiments, the information relating to field replaceable unit thermal properties may comprise thermal parameters and/or thermal equations adapted for application to thermal sensors. For example, a critical threshold function f may be stored which is a function of temperature t and airflow a. Accordingly, an equation may be stored in a suitable storage device, for example an electrically-erasable programmable read-only memory (EEPROM), that directs a manageability controller to acquire sensor readings t and a and apply the readings to the equation.

Other examples of thermal and power characteristics that may be stored in the non-volatile memory 104 are physical size or dimensions, air flow resistance properties, and physical properties in combination with heat dissipation characteristics. For example, a field replaceable unit such as a disk drive is typically bulky in form, generates a large amount of heat so that significant cooling is warranted, and leaves little space for passing throughput of air flow. In contrast, a memory such as a DIMM has a large amount of space to allow passing air flow, is typically arranged in planes forming a clear air flow pathway, but also generates significant heat and warrants a large amount of cooling. Information stored in the memories 104 for the disk drive and DIMM field replaceable units 102 accordingly may store one or more information fields that express the pertinent thermal characteristics. Information may be stored which identify how fans upstream and downstream of the field replaceable units 102 may be managed or controlled according to the thermal and power characteristics.

Information is embedded in the field replaceable unit non-volatile memory 104 (FRU EEPROM) to make the information available and accessible to various controllers and systems in a data center and to devices such as a data center management engine. Although some conventional field replaceable units may have a memory for saving various information, information relating to power and cooling characteristics is not stored or available for management and control purposes, and is typically only accessible to data center management personnel by manually accessing sources such as operating manuals, either in the form of printed or online publications. In contrast, the illustrative thermal management apparatus 100 supports storage of power and cooling information in the memory 104 of a field replaceable unit 102 to enable automatic and autonomous access and usage for control and management.

Figure 2A:
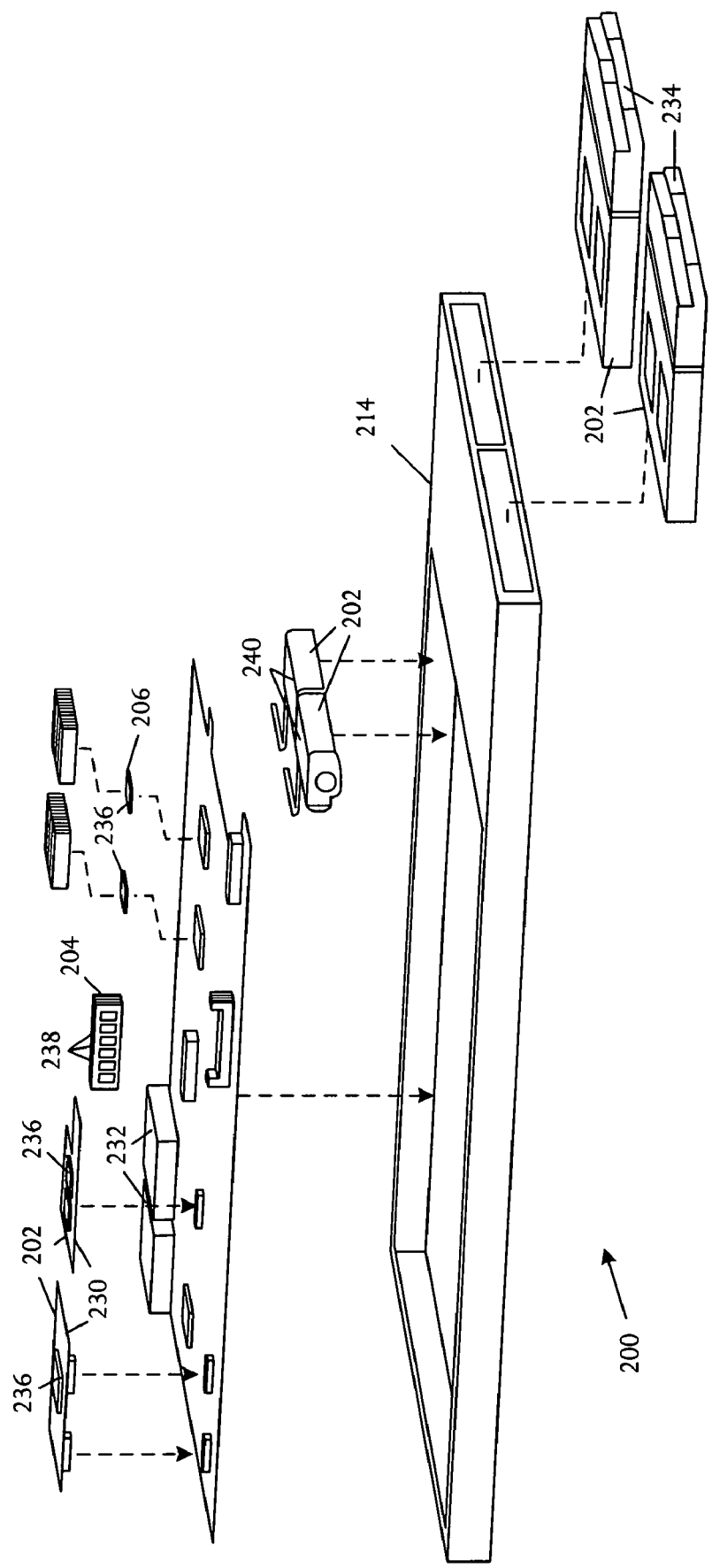
FIGS. 2A and 2B are perspective pictorial diagrams illustrating an embodiment of an electronic device into which one or more field replaceable units may be installed.
Figure 2B:
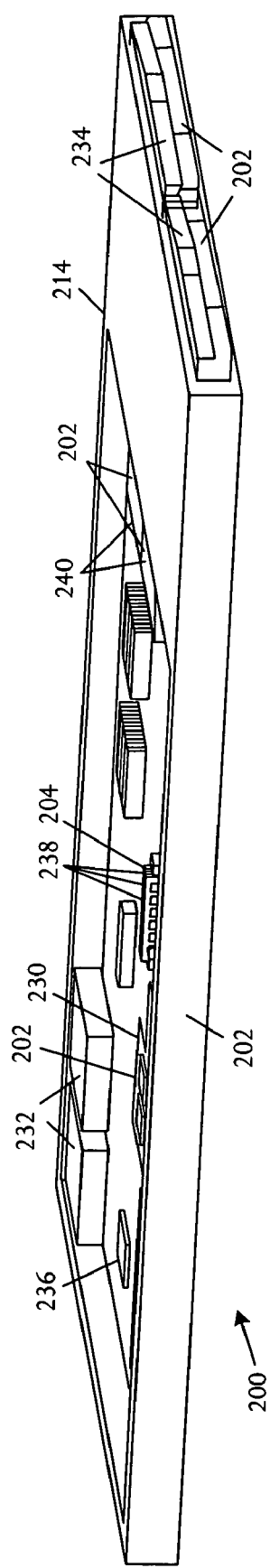

Referring to FIGS. 2A and 2B, perspective pictorial diagrams illustrate an embodiment of an electronic device 200 into which one or more field replaceable units 202 may be installed. A field replaceable unit (FRU) is defined as a hardware component that can be removed and replaced onsite. Common types of field replaceable units 202 include printed circuit cards 230, power supplies 232, storage devices such as disk drives 234, processors and/or processing modules 236, memories and/or memory modules such as Dual In-line Memory Modules (DIMMs) 238, communication interfaces, chassis or housing 214, chassis components, and the like. In some embodiments, each processor 236, each board 230, and/or any individual device, component or element, and the chassis 214 may be a field replaceable unit.

The electronic device 200 may include a controller 206 configured and programmed to operate as a management controller, for example in the manner of a Base Management Controller (BMC). The controller 206 is adapted to monitor, manage, and control environmental and health state of devices, components, and elements within a system. In some configurations, the controller 206 manages the overall system.

The controller 206 may be programmed to track the inventory of field replaceable units 202 contained within the chassis 214. One of the challenges in tracking environmental and health conditions of an electronic device 202 is the wide variability in configuration of the device. Multiple processors 236 of different types and widely different power and heat dissipation characteristics may be installed within the chassis 214. Different numbers of memory DIMMs 238, Peripheral Component Interconnect (PCI) cards, and disks 234 may be installed in the chassis 214, each having variable heat dissipation and power specifications. Accordingly, the task of determining the combination of elements and impact in terms of total power consumption, heat generation, and airflow requirements is problematic.

To address this difficulty, the controller 206 may be configured for operation in a Base Management Controller (BMC) capacity to recognize and identify field replaceable unit components 202 when installed in the chassis 214, read the memory 204 associated with the individual field replaceable units 202, and add the component to an inventory in combination with the accessed thermal and power characteristics in real-time and automatically without user intervention. For example, the controller 206 may track power draw for all FRUs of the electronic device 200 including all devices, components, and elements contained within the chassis 214, and also including the chassis 214. In some implementations, stored information may include specification of maximum, minimum, and average power draw to enable aggregate analysis of operation and determination of best-case, worst-case, and typical operating conditions. For example, the controller 206 may analyze aggregate specifications of all components and determine a worst-case specification. Similarly, the controller 206 may access information identifying heat dissipation within the chassis 214 and appropriate operating temperature for components including maximum and minimum temperatures for stable operation. The controller 206 may determine the amount of heat produced, the ventilation appropriate for the heat production, air flow resistance within the chassis 214, and air flow drive that can be produced by fans 240 attached to generate the air flow. The controller 206 and fans 240 may be configured in combination to enable the controller 206 to select fan speed according to the analysis.

In the illustrative electronic device 200, thermal and power information may be stored in distinct memories 204 associated with the individual field replaceable units 202 and aggregated by a controller 206 for usage in managing thermal and power characteristics of the electronic device 200. The illustrative system differs from a system in which information is hard-coded with the chassis 214 by adding a capability for upgrading and adding to the electronic device 200. Upgrades may include replacement of processors, memories, storage devices, and fans with enhanced elements having significantly different thermal and power properties and characteristics. For example processors may be added that have different power requirements. Upgraded fans may have greater or lesser air flow drive. Similarly, devices and components may be added to empty slots in the chassis 214. In the illustrative system, the controller 206 may access information from memories 204 of the upgraded or added field replaceable units 202 and modify the overall electronic system thermal and power characteristics accordingly.

The illustrative system may be configured to support automated identification of the location of devices, components, and elements, including field replaceable units, to generate an autonomous map of the data center. For example, electronic systems such as radio frequency identification (RFID) and global positioning system (GPS) may be used by a controller such as a Base Management Controller (BMC) or other manageability agents executing manageability software to identify the location of devices, components, and elements in a data center, including field replaceable units. The location information may be used in combination with the thermal and power information stored in the field replaceable units to enable mapping of the data center. In some implementations, a full mapping encompassing all field replaceable units may be mapped automatically and in real time.

Figure 3:
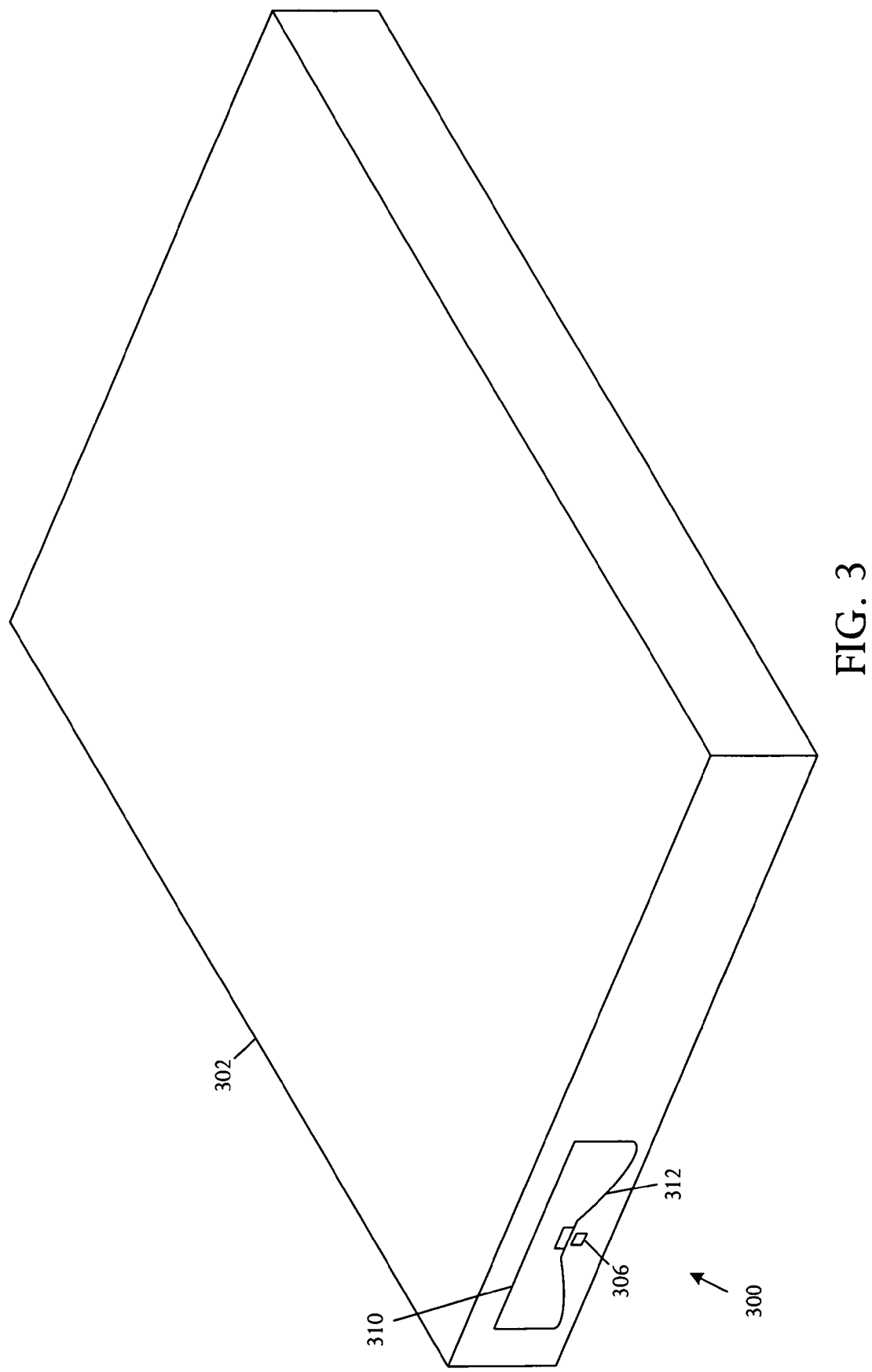
FIG. 3 is a perspective pictorial diagram showing an embodiment of a thermal management apparatus which is adapted to identify location of a field replaceable unit.

Referring to FIG. 3, a perspective pictorial diagram illustrates an embodiment of a thermal management apparatus 300 which is adapted to identify location of a field replaceable unit 302. The thermal management apparatus 300 further comprises a location identifier 310 coupled to a field replaceable unit 302 and a controller 306. The controller 306 is configured to map location of the individual field replaceable units and generate information for usage in dynamically mapping, in real-time, the temperature profile of the data center based at least partly on the mapped location.

In some embodiments, the location identifier 310 may be a radio frequency identification (RFID) tag 312 coupled to one or more of the field replaceable units 302. The controller 306 may be configured to operate as at least part of a Global Positioning System (GPS). The controller 306 may map location of selected field replaceable units 302 and generate information for real-time dynamic temperature mapping of the data center based at least partly on the mapped location.

Location identification in combination with encoding of the thermal and/or power characteristics of a field replaceable unit enables information for a potentially very large number of field replaceable units to be integrated and aggregated, enabling determination of thermal and power profiles of multiple units distributed within a data center for usage by a management controller.

Figure 4:
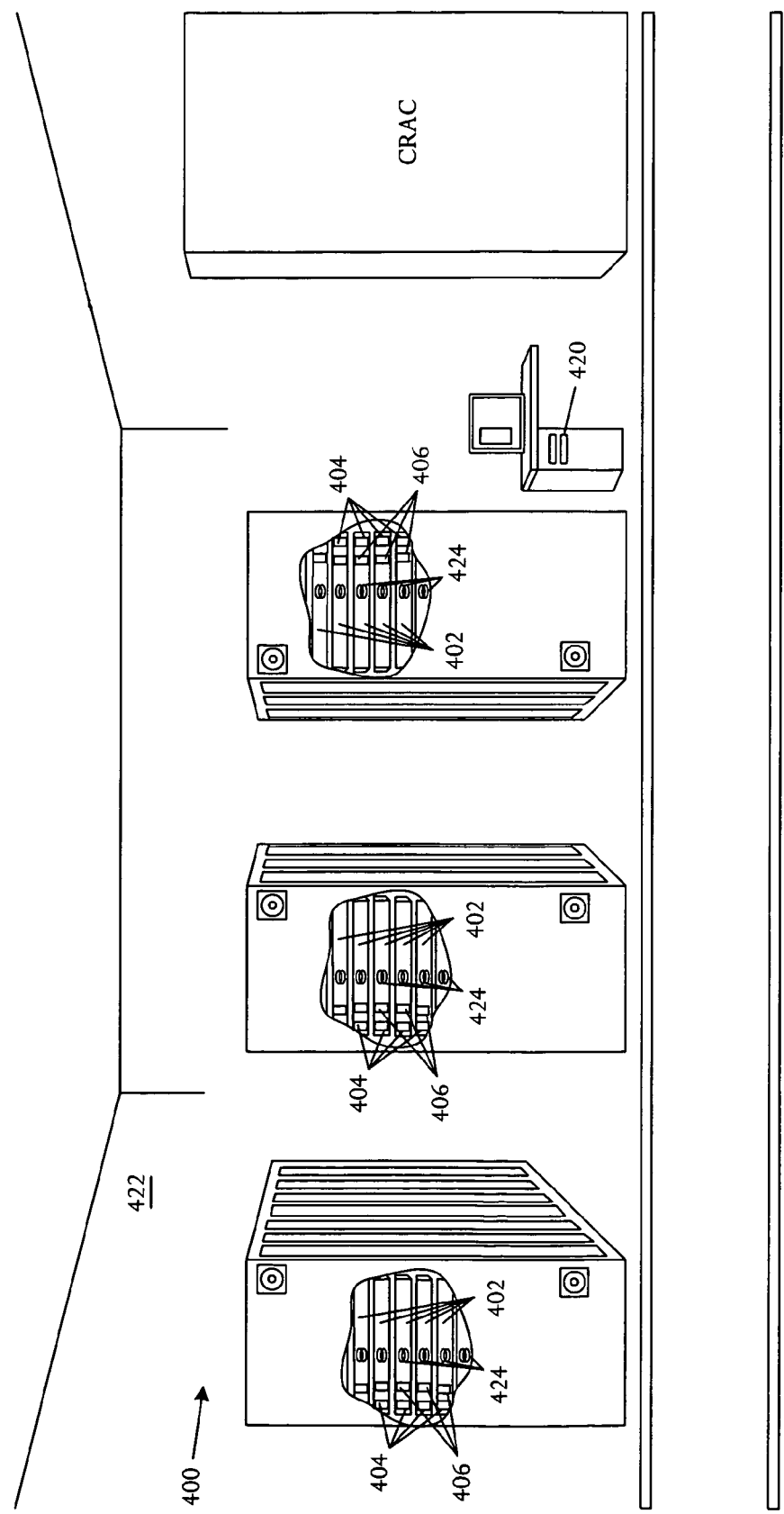
FIG. 4 is a perspective pictorial diagram illustrating an embodiment of a thermal management apparatus including a thermal modeling controller.

Thermal modeling tools may be used to predict dynamic changes to the environment in a data center. The mapping and layout is determined in accordance with power and thermal usage based on information stored for the individual field replaceable units, system location information, and cooling system capabilities. The modeling program is configured to create a theoretical temperature profile of the data center. Referring to FIG. 4, a perspective pictorial diagram illustrates an embodiment of a thermal management apparatus 400 including a thermal modeling controller 420. The thermal modeling controller 420 may be remote from a field replaceable unit 402 and communicates with controllers 406 internal to or associated with one or more field replaceable units 402 to monitor information relating to field replaceable unit thermal properties and field replaceable unit location information. The thermal modeling controller 420 may compile and/or analyze the monitored information and generate a theoretical temperature profile of a data center 422.

Radio frequency identification (RFID) tags 424 may be affixed to selected field replaceable units 402 and enable the thermal management controller 420 to determine location of the field replaceable units using triangulation of the radio frequency identifier (RFID) tags 424. Known positioning of the field replaceable units 402 enables the thermal management controller 420 to generate information for real-time dynamic temperature mapping of the data center 422 based at least partly on the determined location.

The thermal management controller 420 may be implemented to execute modeling programs adapted to advise modifications to system or data center configuration based on analysis of thermal and power information read from the memories 404 of the field replaceable units 402. In some conditions and circumstances, the thermal management controller 420 may execute the models based on sensor measurements acquired dynamically in the data center 422. For example, the thermal management controller 420 may respond to installation of a new server by accessing thermal and power information from the server, determining based on pre-existing modeling of the data center 422 that thermal and power needs of the new server cannot be met at the present installation location but can be met by installing the server in a different location, and generating a warning and informational message identifying the condition and potential solution. Similarly, the thermal management controller 420 may analyze thermal and power information for the new server and the pre-existing model of the data center to determine that appropriate cooling for the upgraded system may be accomplished simply by adjustment of fans or floor tiles.

Figure 5A:
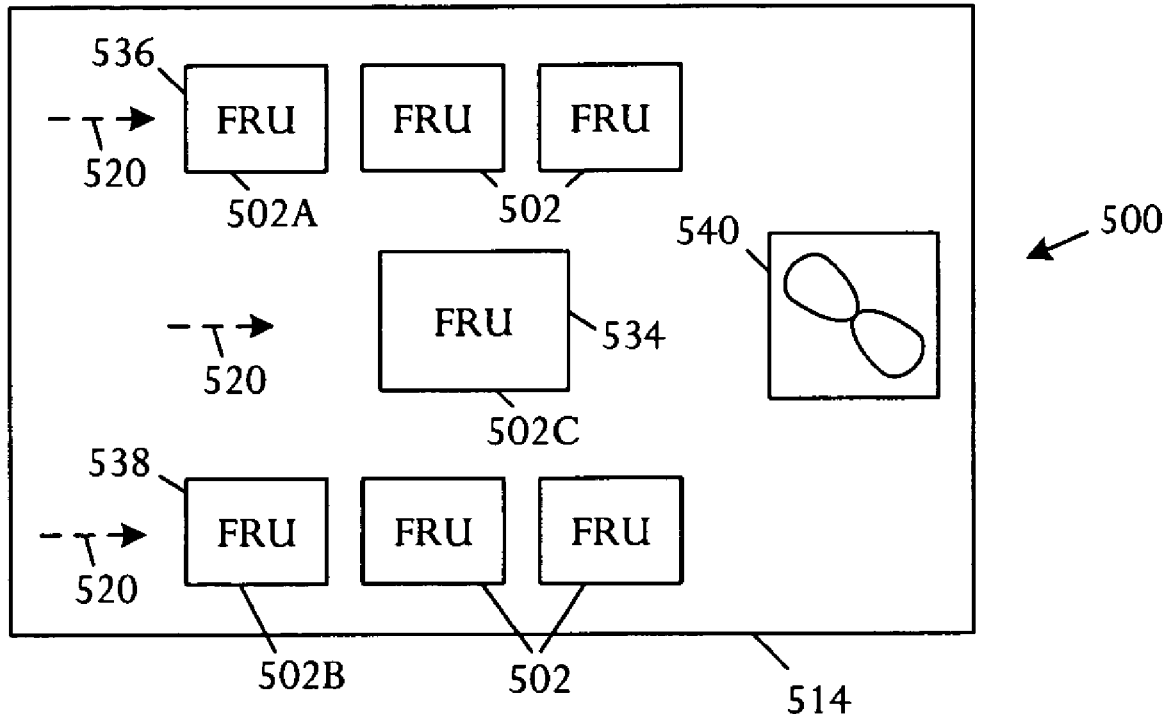
FIGS. 5A and 5B are a schematic block diagram and a corresponding airflow circuit diagram respectively illustrating airflow characteristics of an electronic device that contains multiple components.
Figure 5B:
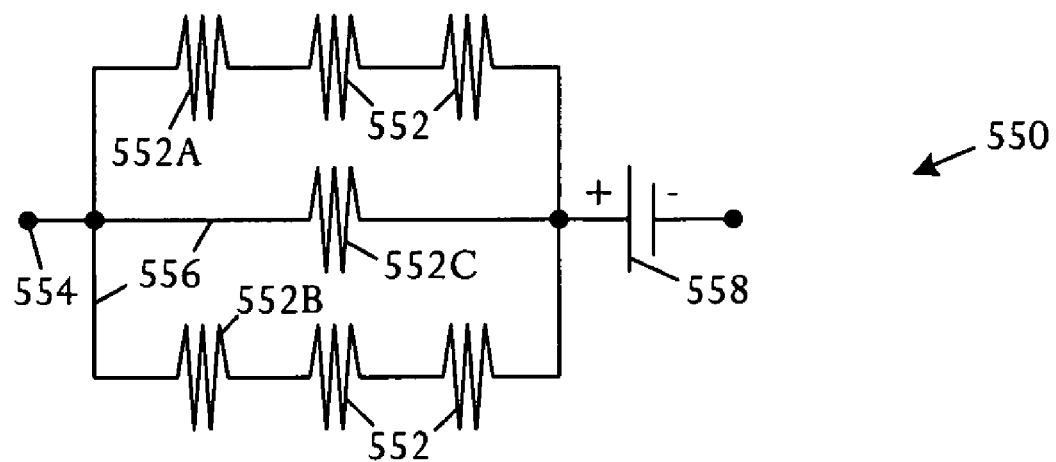

Referring to FIGS. 5A and 5B, a schematic block diagram and a corresponding airflow circuit diagram respectively illustrate airflow characteristics of an electronic device 500 that contains multiple components, which may be considered to be field replaceable units 502, within a chassis 514. The airflow circuit diagram 550 shown in FIG. 5B illustrates air flow phenomena as analogous to electrical phenomena in an electric circuit diagram. The schematic block diagram depicts the components 502 which form airflow resistances in combination with fans 540 operating to drive air flow in the manner that a voltage source drives current flow.

Figure 6:
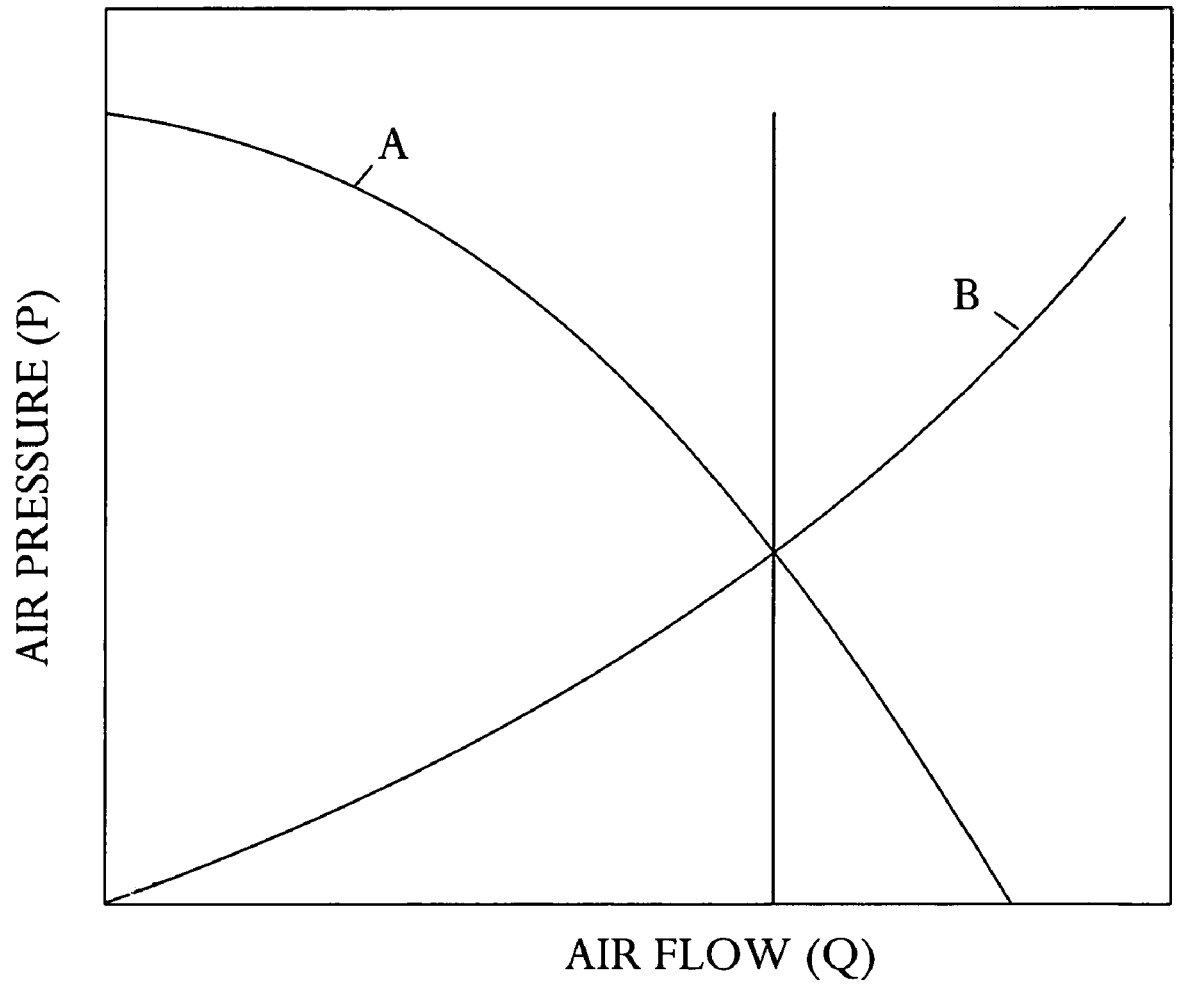
FIG. 6 is a schematic graph depicting a pressure (P) and air flow (Q) curve indicating pressure drop in an electronic device.

Referring to FIG. 6, a schematic graph depicts a pressure (P) and air flow (Q) curve indicating pressure drop in an electronic device. Curve (A) illustrates an example of the pressure drop generated by fans driving air into a space within a chassis. Curve (B) shows an example of the pressure drop due to air flow resistance created by a component within the chassis. The pressure drop curve for any component has the general shape of a relatively straight horizontal line at low flow rates which slopes upward in a squared relationship at higher flow rates. The slope of the line increases with dense objects which result in a higher air flow resistance. For example, a disk drive is highly dense, creating a high resistance to air flow which results in a relatively large pressure drop even at low air flow rates. A more open component such as a memory stick or DIMM has a more shallow pressure drop curve.

The graph shows a pressure drop versus flow rate relationship. Curve (A) illustrates the flow rate generated by the fan and slopes downward. Curve (B) depicts flow resistance formed by the component and slopes upward. The intersection of the two curves (A) and (B) is the system operating point. A controller such as the controller 406 and thermal management controller 420 depicted in FIG. 4 may be operated to execute manageability software that calculates the operating point. Similarly, the controller may operate fans based on the calculated operating point to control fan speed for temperature adjustment. For example, a controller for a server with a complex combination of DIMMs on one side, disks on an opposing side, and multiple fans attached to the back of the server chassis may perform the analysis and determine the operating point to set fan speed for driving each of the multiple fans and properly set operating temperature within the chassis.

Referring again to FIGS. 5A and 5B, the controller may include a program code that accesses the information structures associated with the field replaceable units for the inventory of units associated with the controller and, based on the information, models the environment. In one example implementation, the modeling program analyzes all components and air flow resistances 552 formed by the components 502. The controller constructs the model as the circuit diagram 550. The model includes an inlet 554 to the system and a series of resistors 552 representing elements or components 502 of the system connected in various-length airflow paths 520. The airflow paths 520 may be considered analogous to circuit interconnect lines 556 in an electrical circuit. For purposes of illustration, an example of a modeled electronic device 500 may include three field replaceable units 502A, 502B, 502C such as a processor 536, a memory 538, and a disk drive 534, respectively. Each of the field replaceable units 502A, 502B, 502C may have different thermal and power characteristics, present different air flow resistances, and thus may be modeled as different resistances 552A, 552B, 552C. Fan 540 generates a driving potential 558 applied to the resistances 552. The controller may operate, for example, as a Base Management Controller (BMC) which models the electronic device 500 according to information stored in association with each component. The controller executes an analysis program which aggregates the circuit diagram representation 550 to an operating curve as shown in FIG. 6, enabling comparison of the fan curve A as the potential to drive air and determine the flow rate of the electronic device system.

Figure 7A:
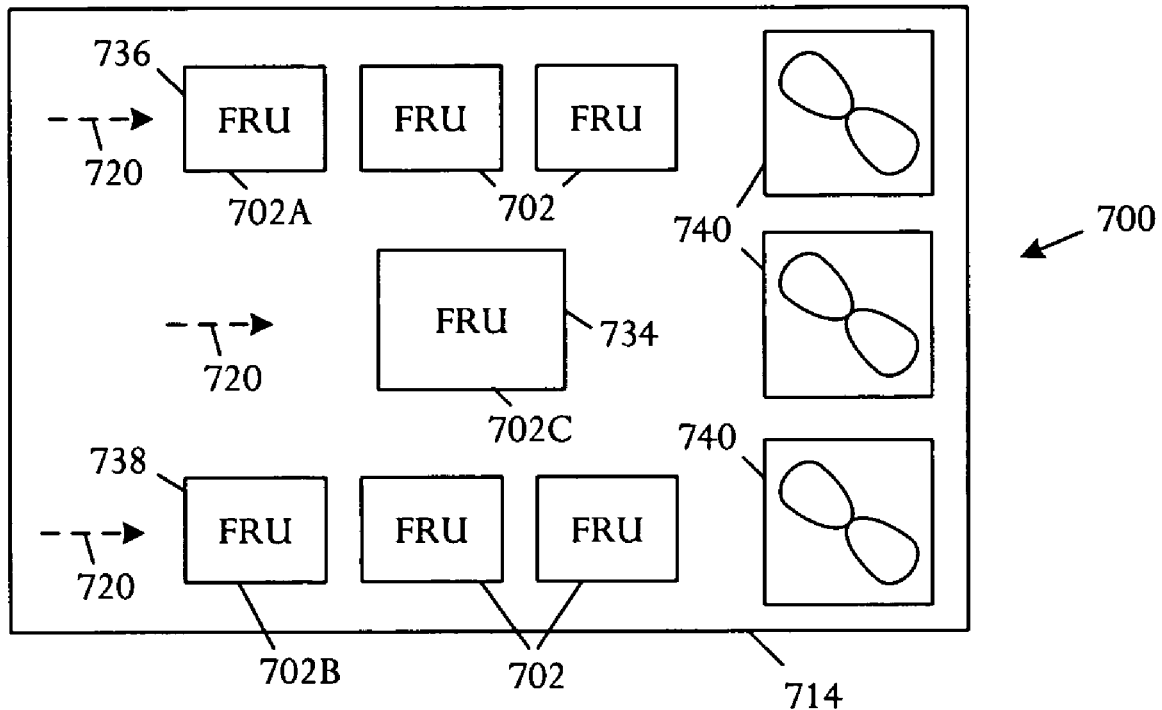
FIGS. 7A and 7B are a schematic block diagram and a corresponding airflow circuit diagram respectively depicting airflow characteristics of a different example of an electronic device that contains multiple components or field replaceable units within a chassis.
Figure 7B:
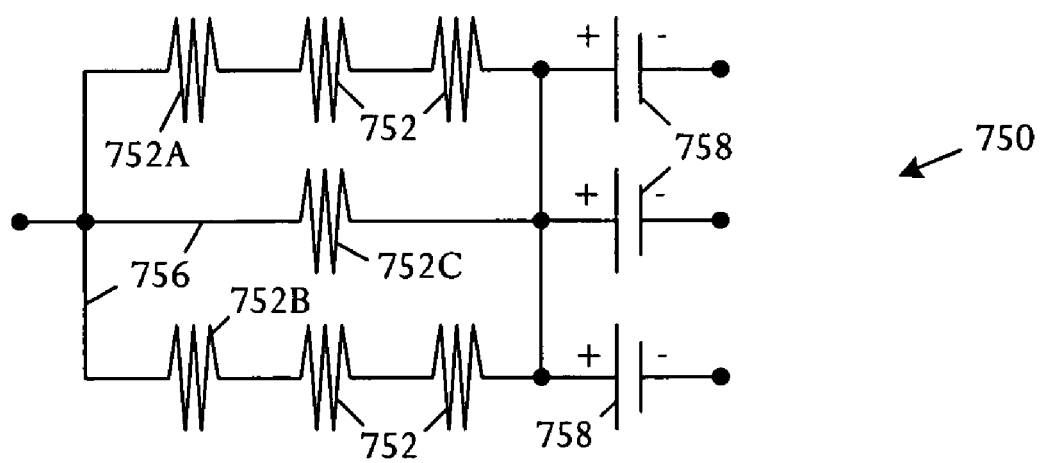

FIGS. 7A and 7B illustrate a schematic block diagram and a corresponding airflow circuit diagram respectively depicting airflow characteristics of a different example of an electronic device 700 that contains multiple components or field replaceable units 702 within a chassis 714. The example shows field replaceable units 702A, 702B, 702C such as a processor 736, a memory 738, and a disk drive 740. In other examples, any appropriate combination of field replaceable units 702 may be included in the configuration. The electronic device 700 has three fans 740 to generate three separate airflow pathways 720. The resistances 752A, 752B, 752C to air flow are in isolated sections that can be controlled individually so that the fan speed can be matched with resistance. A more complex system may have mixing of the pathways that can be modeled using more sophisticated analysis.

Modeling of the air flow is based on analogy to electronic circuit 750 modeling with fans representing a potential or voltage source 758, components 702 simulating air flow resistance 752, and air flow pathways 720 operating as circuit interconnect lines 756, enabling dynamic modeling of air flow. In other embodiments, any other appropriate known modeling techniques may be implemented.

The illustrative example describes modeling of the individual components, elements, and/or field replaceable units in a server. In other embodiments, the airflow resistance of the entire server may be calculated or may be hard-coded, for example as a worst-case resistance, and the information may be used at the rack level to determine appropriate placement of a particular server in the rack. For example, air flow from floor tiles is generally stronger at lower levels of the rack. A controller may analyze and model air flow requirements and resistances of individual servers and generate messages indicating a proper vertical ordering of the servers in the rack. A management system may recommend that servers which are particularly demanding of air flow be positioned where air flow is greatest based on the information and analysis.

Figure 8:
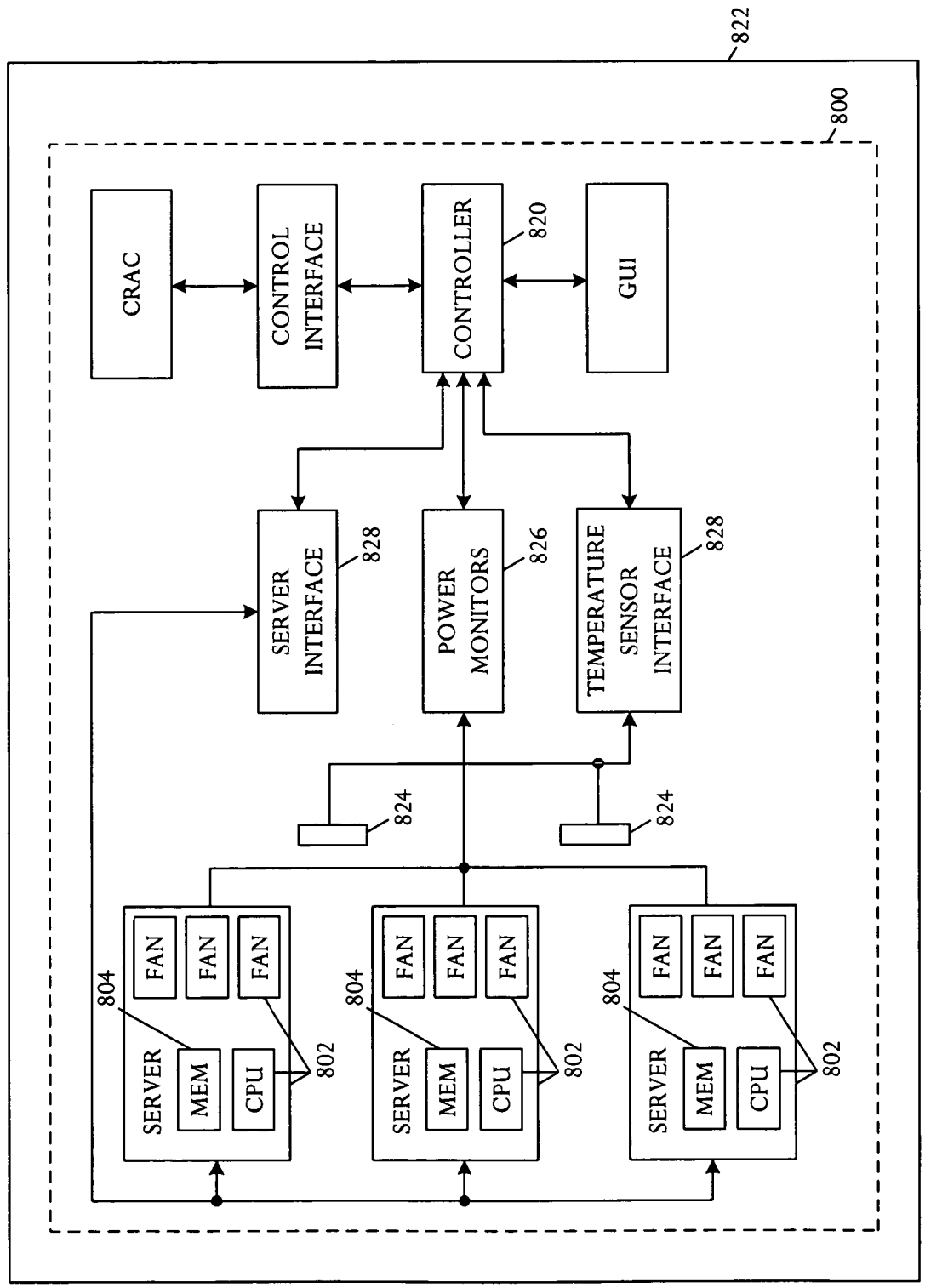
FIG. 8 is a perspective pictorial diagram illustrating an embodiment of a thermal management apparatus which includes a thermal modeling controller adapted to acquire temperature information and perform a thermal modeling operation based on the temperature information.

Various available thermal and power measurement devices may be used in combination with the stored field replaceable unit thermal and power information to facilitate management and control operations. For example, a data center may include multiple temperature sensors embedded in various electronic devices, components, field replaceable units, and the like, along with power monitoring circuitry. Manageability applications are arranged to receive information from the distributed sensors, for example by line or wireless communications. The measurements may be input to the controller for execution in a power and/or thermal management tool. The management tool may adjust flow patterns and generate information alerting data center personnel or users of existence of hot spots in the data center on a component-by-component basis. Referring to FIG. 8, a perspective pictorial diagram illustrates an embodiment of a thermal management apparatus 800 which includes a thermal modeling controller 820 adapted to acquire temperature information and perform a thermal modeling operation based on the temperature information. The thermal management apparatus 800 comprises a plurality of temperature sensors 824 distributed in a data center 822 and adapted to communicate with the thermal modeling controller 820, typically by line or wireless communication. A plurality of power monitors 826 may also be distributed in the data center 822 and adapted to communicate with the thermal modeling controller 820 by line or wireless communication. The thermal modeling controller 820 may further be configured to adjust air flow patterns based on the data center theoretical temperature profile, temperature measurements from the plurality of temperature sensors 824, and power measurements from the plurality of power monitors 826.

The thermal modeling controller 820 may be programmed with executable program code adapted to manage conditions in the data center 822. The thermal modeling controller 820 monitors temperature and power measurements from selected respective temperature sensors 824 and power monitors 826 which are distributed in the data center 822. The thermal modeling controller 820 may also read information from memories 804 such as non-volatile memories associated with the field replaceable units 802, including field replaceable unit thermal property information. The thermal modeling controller 820 may also determine the location of the field replaceable units 802, for example by reading the information from the memories 804 or through usage of position-identifying sensors. The thermal modeling controller 820 may further execute a program code that generates a theoretical temperature profile of the data center 822 based on the monitored measurements and read information.

Temperature sensors 824 may be distributed in the data center 822 in any location associated with field replaceable units 802 or other components or as stand-alone sensor devices. The thermal modeling controller 820 may access temperature measurements and identify a temperature distribution profile in the various locations of the data center 822. The controller 820 may monitor an inventory of field replaceable units 802 and other equipment in the data center along with temperature and power information associated with the equipment. Accordingly, temperature may be controlled according to the analysis by appropriately managing fan speed for fans distributed in the data center 822 and managing power supplied to the inventory of field replaceable units 802 and equipment.

In some implementations, the thermal modeling controller 820 may be further adapted to detect hot spots in the data center 822 and respond by controlling fan speed or by generating alert messages indicating locations of hot spots in relation to positions of the field replaceable units 802. In some configurations, the thermal modeling controller 820 may also detect failures in other resources and appropriately respond to the failures. For example, the controller 820 may read sensors such as tachometers indicative of fan speed to enable detection of a failed fan. Similarly, power monitors may be used to detect power supply failures. The controller 820 may respond to a power supply failure, for example, by shifting task execution among servers and powering down equipment in an affected area.

In some implementations, the thermal modeling controller 820 may be further configured to analyze the data center theoretical temperature profile, temperature measurements from selected temperature sensors 824, and power measurements from selected power monitors 826. The thermal modeling controller 820 may use results of the analysis to determine a configuration of field replaceable units 802 that improves thermal and power condition balance.

The thermal sensors 824 and power monitors 826, in combination with thermal and/or power information accessed from the field replaceable units 802, supply sufficient information to the thermal modeling controller 820 to address dynamic changes in configuration, either in the event of user additions or modifications to the system or due to changed conditions such as failures. For example, if processor power consumption increases, producing a larger draw on a power supply, the potential supply profile changes and is detected by the thermal modeling controller 820. The controller 820 is adapted to dynamically address the changed conditions if possible, and otherwise generate a warning message to enable appropriate intervention.

In another example, the thermal modeling controller 820 may receive measurements from the temperature sensors 824 and compare the temperature against thermal specifications stored in memories of the field replaceable units 802. If measured temperatures are out of range or trend into a warning range, the controller 820 may de-allocate segments of the system. Similarly, when a new component is installed in the system, the controller 820 may compare temperature measurements and available power from the power monitors 826 to component specifications before power is applied to the component. According to the comparison, the thermal modeling controller 820 may intervene to prevent overheating of the new component and drawing of more power than can be supported.

The thermal modeling controller 820 may also use the analysis to execute a dynamic workload balancing action that selectively activates and deactivates selected field replaceable units 802 based on one or more of the data center theoretical temperature profile, temperature measurements from designated temperature sensors 824, and power measurements from designated power monitors 826.

The thermal modeling controller 820 may be further programmed to control cooling in the data center 822 by adjusting air flow patterns based on the theoretical temperature profile, temperature measurements, and power measurements determined by measurements and analysis.

In some embodiments, programming in the thermal modeling controller 820 may be configured to analyze the data center theoretical temperature profile, temperature measurements, and power measurements to enhance system controllability and enable future-proofing of a system for addition of new resources with substantially different operating characteristics and specifications than previously-installed resources. Based on the analysis, the thermal modeling controller 820 may configure a field replaceable unit configuration that improves thermal and power condition balance. In some conditions or arrangements, the thermal modeling controller 820 may balance system dynamic workload by selectively activating and deactivating selected field replaceable units 802 based on the analysis of the data center theoretical temperature profile, temperature measurements, and power measurements.

Environment management in a conventional data center is typically supplied using one or few thermostats to coarsely measure and set temperature. Generally no or little information is available concerning localized temperatures and/or air flow. Typically, when a new data center is constructed, the commissioning process involves arranging equipment racks and floor tiles to supply air flow. Manual air flow measurements are traditionally made using hoods placed over the tiles. Racks and floor tiles are positioned to produce approximately uniform temperature and airflow throughout the data center according to estimates of equipment loading in the racks. Racks are often selected in anticipation of gradual growth so that racks are sparsely populated at first and supplemented as demands increase. Accordingly, cooling and power demand are not a problem until relatively late in the data center life cycle. As population of devices in the racks increases, cooling and sufficient power resources may become a problem.

The thermal management system may also use data center-wide management tools which are specially configured to use sensor measurements and stored thermal and/or power information to collect data and modify the data center environment. The thermal management system may also use data center-wide management tools which are specially adapted to use the sensor measurements and stored thermal and/or power information to recommend physical changes to the environment. The combined sensor measurements and thermal and/or power information stored on a per-FRU basis enable data center management tools to autonomously make recommendations to move equipment, improve balance the thermal and/or power load, and/or move temperature and power-sensitive equipment to cooler locations in a data center. Referring to FIG. 8, a schematic block diagram depicts an embodiment of an apparatus 800 configured for thermal management in a data center 822. The data center thermal management apparatus 800 comprises a thermal management controller 820 with interfaces 828 for communicating with a multiple field replaceable units 802, temperature sensors 824, and power monitors 826 distributed in the data center 822. The thermal management controller 820 also monitors temperature measurements from the temperature sensors 824, power measurements from the power monitors 826, and information relating to thermal properties and location of the field replaceable units 802, and is adapted to generate a theoretical temperature profile of the data center 822 based on the monitored measurements and information.

The illustrative thermal management apparatus 800 may further include various temperature sensors 824 and power monitors 826 selectively distributed throughout the data center 822, typically in association with various devices and components such as storage devices and arrays, storage and array controllers, servers, routers, communication appliances, and the like. The thermal management controller 820 may execute processes which adjust air flow patterns based on the theoretical temperature profile of the data center 822, the temperature measurements, and the power measurements.

Figure 9:
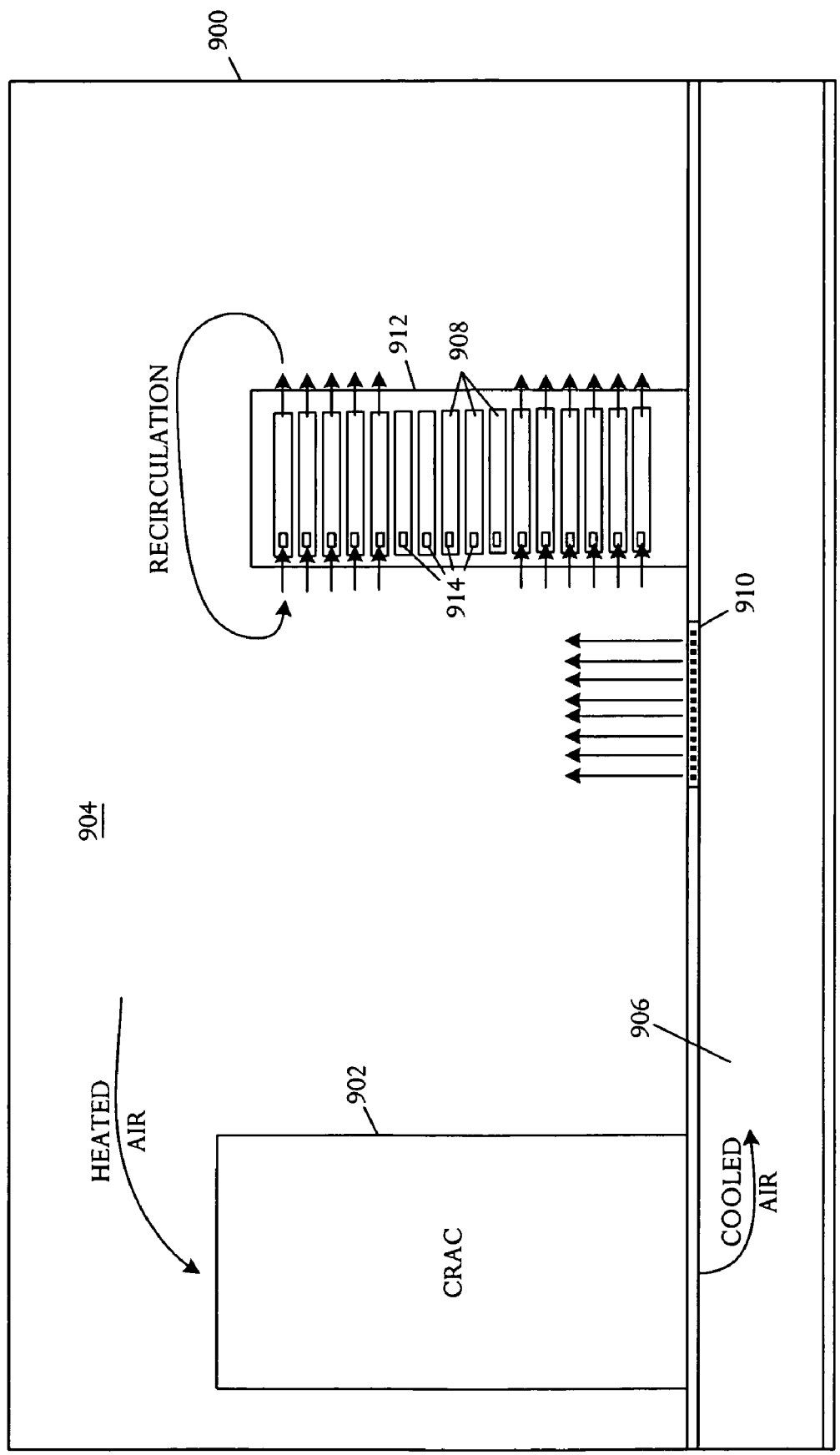
FIG. 9 is a schematic pictorial diagram showing a perspective view of a data center that implements the illustrative thermal and power management techniques.

Referring to FIG. 9, a schematic pictorial diagram illustrates a perspective view of a data center 900 that implements the illustrative thermal and power management techniques. During operation with environment management disabled, a computer room air conditioner (CRAC) 902 pulls heated air from the room 904 and supplies cool air to an under-floor plenum 906. Airflow to individual computers and servers 908 is controlled by the position and relative open area of perforated tiles 910. With environment management disabled, as in conventional data centers, temperature is measured at a sensor at the air return inlet of the CRAC 902, the location of mixed heated and cool air. Temperature control is limited since measurement of air flow temperature at the return inlet gives insufficient secondary information about conditions local to the field replaceable units and devices distributed in the data center 900. Selection of the amount of airflow sufficient to cool any individual rack or cabinet 912, or any individual computer or server, is simply by estimation. For example, worst case airflow criteria for all equipment in a rack can be summed and the CRAC 902 sized to supply at least the summed airflow. The traditional technique commonly supplies an incorrect airflow amount, either too high or too low.

With environmental management enabled, temperature sensors 914 may be distributed in the data center 900 and positioned close to the inlet of servers or computers 908 so that control may be based on conditions local to operating devices and components in combination with thermal and/or power characteristics of the devices and components.

Difficulties may arise if the air supply to the rack is insufficient. An ideal airflow amount supplies cooled air up to the top level of the rack 912 so that every computer or server 908 in the rack receives suitable ventilation, generally entering at the front and exiting at the rear of the rack. If an inadequate airflow is supplied, cooling air and filtration extends only partially up the rack 912 so that heated air re-circulates in devices 908 in higher shelves of the rack 912, resulting in inadequate cooling. The illustrative thermal control technique enables monitoring and control of airflow in all computers and servers 908 in the rack 912 according to stored thermal and/or power characteristics of the individual components and devices, and may be implemented in a control process that adjusts the supply of cooling air to the equipment. In a particular implementation, fans in servers at lower levels of the rack may be throttled back while fans in servers at higher levels in the rack are run at higher speeds to drive airflow to higher elevations in the data center.

The thermal management technique accordingly enables tailoring of airflow to match the changing conditions in the data center 900.

Multiple factors drive overall system airflow, measured in cubic feet per minute (CFM) including ambient temperature, software execution load, configuration, altitude, and other factors. Ambient temperature is a highly prominent factor so that addition of a new server into relatively hot location in a data center configuration incapable of adjusting system airflow may cause the temperature to increase uncontrollably due to re-circulation of heated air. The illustrative technique uses information such as local airflow resistance, device spacing, internal component inventory, device heat dissipation, fan speed data indicative of airflow, and other characteristics to facilitate manual and/or automatic control of data center environment and to terminate re-circulation leading to overheating.

In the illustrative data center 900, automated thermal and power management techniques may be based partly on measurements of total airflow consumption including measurements of airflow derived from fan speed, pressure, and/or direct flow measurements from an anemometer and local ambient temperature information both at the front and rear of the racks 912. The information can be used to control overall system volume flow produced by computer room air conditioning 902 and to adjust the open area of perforated tiles 910 at various suitable locations in the data center 900, thereby controlling local airflow. Dynamic sensing of airflow and load information in multiple individual locations and for multiple individual heat dissipating elements enables autonomous adjustment of cooling resources based on overall and local system conditions. Automated thermal and power management further can enable energy savings, allowing cooling reduction in low-load conditions while ensuring absolute maximum cooling for high-load operations under feedback control.

Sensing of temperature and airflow in combination with reading of thermal and power information enables a data center manager or user to view the amount of air drawn by each individual server 908 and accordingly can be used to facilitate arrangement and configuration of components, devices, and other structures in the data center 900. For example, airflow sensing may be used to detect overly-constrained signal cabling in a rack that impedes flow through the rack or locations in a room which are starved for air, resulting in a high ambient temperature.

Sensing and monitoring of thermal and power characteristics of the field replaceable unit inventory may also be used to make policy decisions. For example workload can be monitored for criticality of work that an individual server is performing. A server performing a higher criticality operation may be supplied with a higher airflow while another server performing a less important operation may be supplied with a lower airflow.

Figure 10A:
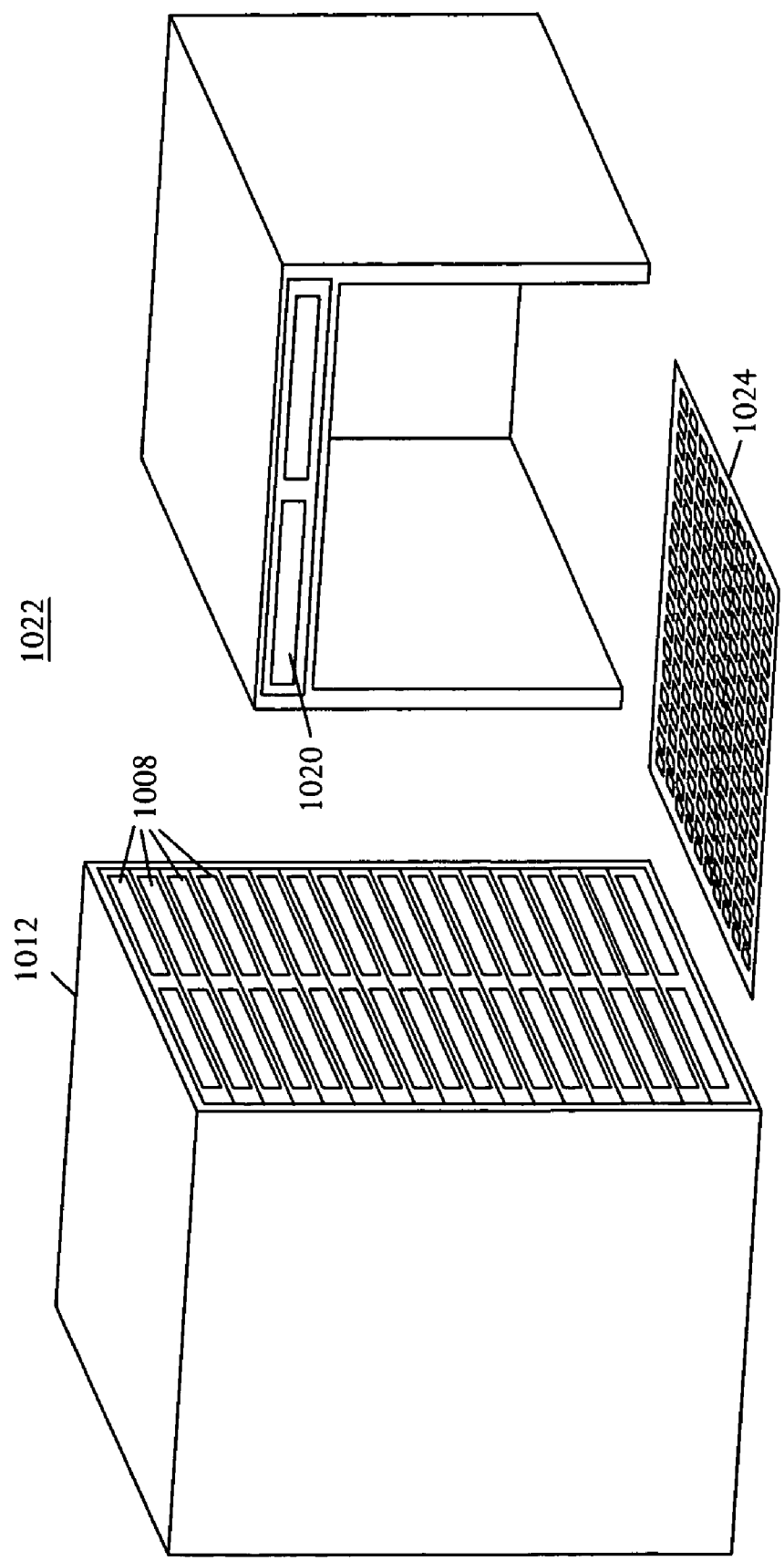
FIG. 10A is a perspective pictorial diagram illustrating an embodiment of a rack or cabinet implementing a thermal management controller.
Figure 10B:
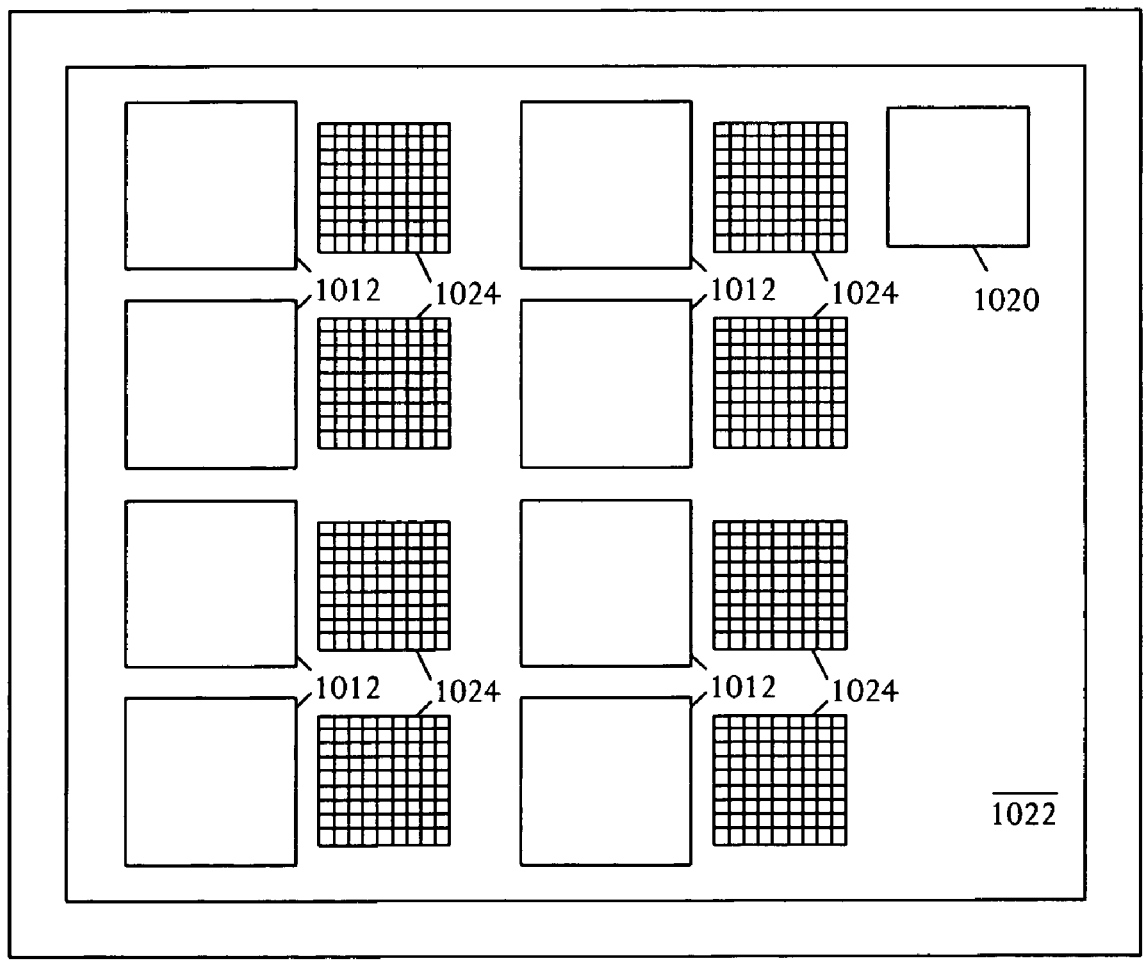
FIG. 10B is an overhead view illustrating a layout of racks or cabinets distributed in a data center.

Referring to FIG. 10A, a perspective pictorial diagram illustrates an embodiment of a rack or cabinet 1012 that implements a thermal management controller 1020. In the illustrative embodiment, the thermal management controller 1020 is implemented as a dedicated instrument or system. In other embodiments, a thermal management controller may be implemented in any suitable configuration, such as a program or a logic executable in a server, a device controller, a computer, a host, an appliance, for example a network appliance, and the like. FIG. 10B is an overhead view illustrating a layout of racks or cabinets 1012 distributed in a data center 1022. In an illustrative embodiment, the thermal management controller 1020 may be implemented as part of a Base Management Controller (BMC) application. The BMC may execute from any suitably interfaced processor within or outside the data center 1022, for example in servers 1008, storage controllers, hosts, workstations, management appliances, and any other device. Usually one BMC may be allocated per server 1008. A partitioned server may have one BMC per partition, for example in the form of a blade or mini-server. A BMC may also be implemented as a central controller in a central management system and may be in any location of the data center or may be external to the data center.

The thermal management controller 1020 performs analysis and control operations, both collecting information and acting based on the collected information. Actions include controlling speeds of fans, controlling power supplied to field replaceable units, communicating information such as power supply information and temperature profiles to a central management station, and other actions.

The thermal management controller 1020 may be adapted to control fans to redirect airflow in the housings or chassis or the servers 1008 and in the racks 1012. The air flow environment inside the chassis' and racks are highly dynamic and the thermal management controller 1020 measures temperature in multiple locations, performs analysis, and produces a temperature profile based on the analysis to enable control of the dynamic state. As part of the analysis, the thermal management controller 1020 determines the system configuration, reads the memories associated with components and determines airflow requirements of the components. For example, when components are added to the system the thermal management controller 1020 may access thermal and/or power information from memories such as EEPROMs for the added components and conditions such as airflow requirements of the added components determined and system characteristics compared following the additions to the air flow drive capabilities of the fans. The fan speed can be increased or decreased according to the new configuration.

In a traditional system, fan speed is typically controlled based on ambient air temperature, driving airflow through the system to that of the worst case configuration. In the configuration described herein, the thermal management controller 1020 can drive the fan speed as low as possible to meet cooling requirements, avoiding over-provisioning which is common in conventional systems.

In some embodiments, the component thermal and/or power information includes specification of parameters ranges such as minimum, maximum, average, and failure condition values of temperatures, power levels, and the like to facilitate control by the thermal management controller 1020.

In various circumstances, the stored information may be used to determine whether a component has failed and, if so, to calculate power consumption of the system including the failed component. For a particular component, failure may cause the power consumption to either increase or decrease, behavior that may be encoded in the memory.

When a component is added to the system, the thermal management controller 1020 may be programmed to access thermal and/or power information from the memory associated with the component, analyze current system operating conditions and budgets, and determine any changes to operating settings to facilitate operating conditions with the added component. For example, the thermal management controller 1020 may adjust power supplied to the various components and speed of one or more fans. For example, fan speed may be increased or decreased in different air flow paths. In some conditions, the thermal management controller 1020 may determine that the power supply is not sufficient to operate with the added component so that the added component is not supplied with power.

In some configurations, the thermal management controller 1020 may be programmed to perform dynamic workload balancing wherein various processes are activated, deactivated, and/or operating parameters modified. The thermal management controller 1020 may monitor time-of-day and/or geographic location, and use time-based averaging to balance work load. For example, non-time-critical operations can be scheduled for night-time execution.

The thermal management controller 1020 may also be used to enable usage of future product or component generations, for example components having significantly different performance, power usage, heat dissipation, air flow resistance, and the like in comparison to components for which a system is originally designed. When a component is installed in the system, the thermal management controller 1020 reads encoded thermal and/or power information for the new component and analyzes impact of the installation on system conditions and parameters. The thermal management controller 1020 may modify system operating parameters to enable installation. If operating conditions cannot be suitably modified to accommodate installation, the thermal management controller 1020 may produce a warning message, prevent power to be applied to the component, or perform any other suitable action. In some conditions, the thermal management controller 1020 may determine that the component or device cannot be installed in the particular location attempted, but may be appropriately installed in another location, for example a rack in a data center that receives sufficient cooling or power to enable installation. Accordingly, the thermal management controller 1020 may generate a message indicating the suitable installation procedure. A capability to address future component generations is desirable in consideration of the long lifetime of data center facilities and the significant evolution of component capabilities and operating characteristics.

A thermal management controller 1020 executing in a server may be programmed to perform management and control operations inside the server chassis, for example in terms of fan speed adjustments and workload management to operate at reduced or increased functionality. The thermal management controller 1020 may also be programmed to perform management and control operations external to the server. The thermal management controller 1020 operating in a server can aggregate information from field replaceable units internal to the server and report the information out to a data center control level. The aggregated information may include physical location, thermal requirements, heat dissipation, power consumption, and the like.

At the data center control level, a central management controller may analyze the aggregated information from multiple servers to enable accurate determination of the amount of air flow pulled through the servers.

FIG. 10A depicts an example arrangement of a rack 1012, such as a 19 inch rack with a height of 42 U although any size rack may be used. The rack 1012 holds multiple servers 1008. In a data center 1022, racks 1012 are typically arranged in rows as shown in the top view depicted in FIG. 10B with a ventilation floor tile 1024 often positioned in front of the individual racks 1012. Cooling air is driven through the floor tile 1024 to supply the rack 1012. The thermal management controller 1020 controls operation of components and assemblies in and outside the servers 1008 to match the air flow delivered by the floor tiles 1024 to requirements of components in the servers 1008.

A conventional system may include temperature sensors but uses the thermal information, at most, for crude control of fan speed typically for acoustic purposes—noise reduction. Conventional systems do not use temperature and/or power sensors for dynamic adjustment based on configuration, usage level, and data center local conditions. Therefore, a conventional system typically uses pre-installation planning and over-provisioning to attain suitable airflow to the entire rack. As racks in the conventional system are loaded with equipment over time, operating conditions change, possibly resulting in performance degradation. For example, a thermal analysis during original installation may indicate that a cooling air supply of 500 ft$^3$/minute is sufficient for a rack 1012 with capacity to hold ten servers 1008 and the generation of servers at original installation has an average air supply requirement of less than 50 ft$^3$/minute. Over time the rack 1012 may become fully populated with subsequent generation servers having an average air supply requirement of 100 ft$^3$/minute, the air supply becomes inadequate so that only servers 1008 at the bottom of the rack 1012 are supplied with cooled air. Servers 1008 at the top of the rack 1012 are supplied with heated air from the environment which re-circulates from the exhaust side to the inlet side of the servers 1008.

The illustrative power and thermal management system improves performance by encoding thermal and/or power specifications for individual components and field replaceable units, monitoring conditions using sensors, and operating the thermal management controller 1020 to access the encoded thermal and/or power information and measurements from the sensors. The thermal management controller 1020 controls components such as fans to manage airflow to the individual components and field replaceable units. The thermal management controller 1020 may monitor sensors positioned in locations associated with individual components and servers to enable local determination of operating conditions. The memories associated with the components and field replaceable units may have multiple information fields for encoding multiple aspects of operating specifications. The thermal management controller 1020 is adapted to analyze a combination of sensor measurements of operating specifications to enable condition control and management. The thermal management controller 1020 controls operating conditions such as air flow and supplied power according to the analysis. In some conditions, the thermal management controller 1020 communicates local information to a centralized data center controller to communicate local conditions and enable intervention to improve operations.

The various functions, processes, methods, and operations performed or executed by the system can be implemented as programs that are executable on various types of processors, controllers, central processing units, microprocessors, digital signal processors, state machines, programmable logic arrays, and the like. The programs can be stored on any computer-readable medium for use by or in connection with any computer-related system or method. A computer-readable medium is an electronic, magnetic, optical, or other physical device or means that can contain or store a computer program for use by or in connection with a computer-related system, method, process, or procedure. Programs can be embodied in a computer-readable medium for use by or in connection with an instruction execution system, device, component, element, or apparatus, such as a system based on a computer or processor, or other system that can fetch instructions from an instruction memory or storage of any appropriate type. A computer-readable medium can be any structure, device, component, product, or other means that can store, communicate, propagate, or transport the program for use by or in connection with the instruction execution system, apparatus, or device.

The illustrative block diagrams and flow charts depict process steps or blocks that may represent modules, segments, or portions of code that include one or more executable instructions for implementing specific logical functions or steps in the process. Although the particular examples illustrate specific process steps or acts, many alternative implementations are possible and commonly made by simple design choice. Acts and steps may be executed in different order from the specific description herein, based on considerations of function, purpose, conformance to standard, legacy structure, and the like.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, a few specific examples of devices and techniques for monitoring airflow are described. The illustrative monitoring techniques and stored thermal and/or power information can be used with any suitable types of sensors and sensed parameters. The illustrative techniques may be used with any suitable data center configuration and with any suitable servers, computers, and devices. Particular examples of air flow modeling techniques are shown for illustrative purposes. In other embodiments, and suitable types of modeling may otherwise be implemented.

What is claimed is:

1. A thermal management apparatus for usage in a data center comprising:

at least one field replaceable unit comprising a non-volatile memory storing information relating to field replaceable unit thermal properties;

a controller coupled to the at least one field replaceable unit and adapted to generate information for real-time dynamic temperature mapping of the data center based at least partly on the stored field replaceable unit thermal properties;

a radio frequency identification (RFID) tag coupled to ones of the at least one field replaceable unit;

the controller adapted to operate as at least part of a Global Positioning System (GPS), map location of the ones of the at least one field replaceable unit and generate information for real-time dynamic temperature mapping of the data center based at least partly on the mapped location; and a thermal modeling controller communicatively coupled to the controller and adapted to monitor information relating to field replaceable unit thermal properties of a plurality of field replaceable units and field replaceable unit location information and generate a theoretical temperature profile of the data center and execute a dynamic workload balancing action that selectively activates and deactivates selected field replaceable units based on the theoretical temperature profile and measurements from at least one temperature sensor and at least one power monitor in the data center.

2. The apparatus according to claim 1 further comprising:
at least one thermal sensor coupled to the at least one field replaceable unit; and
the information relating to field replaceable unit thermal properties comprises thermal parameters and/or thermal equations adapted for application to the thermal sensors.

3. The apparatus according to claim 1 further comprising:
the non-volatile memory storing information relating to field replaceable unit thermal properties including one or more properties selected from a group consisting of airflow, temperature rise across the field replaceable unit, and package size.

4. The apparatus according to claim 1 further comprising:
a location identifier coupled to ones of the at least one field replaceable unit; and
the controller adapted to map location of the ones of the at least one field replaceable unit and generate information for real-time dynamic temperature mapping of the data center based at least partly on the mapped location.

5. The apparatus according to claim 1 further comprising:
a plurality of temperature sensors distributed in the data center coupled to the thermal modeling controller;
a plurality of power monitors distributed in the data center coupled to the thermal modeling controller; and
the thermal modeling controller further configured to adjust air flow patterns based on the data center theoretical temperature profile, temperature measurements from the plurality of temperature sensors, and power measurements from the plurality of power monitors.

6. The apparatus according to claim 5 further comprising:
the thermal modeling controller further adapted to detect hot spots in the data center and generate alert messages indicative of hot spot location in relation to location of the field replaceable unit plurality.

7. The apparatus according to claim 5 further comprising:
the thermal modeling controller further configured to analyze the data center theoretical temperature profile, temperature measurements from the plurality of temperature sensors, and power measurements from the plurality of power monitors, and to determine a field replaceable unit configuration that improves thermal and power condition balance.

8. A thermal management apparatus for usage in a data center comprising:
at least one field replaceable unit comprising a non-volatile memory storing information relating to field replaceable unit thermal properties;
a controller coupled to the at least one field replaceable unit and adapted to generate information for real-time dynamic temperature mapping of the data center based at least partly on the stored field replaceable unit thermal properties;
a thermal modeling controller communicatively coupled to the controller and adapted to monitor information relating to field replaceable unit thermal properties of a plurality of field replaceable units and field replaceable unit location information and generate a theoretical temperature profile of the data center;
a plurality of temperature sensors distributed in the data center coupled to the thermal modeling controller;
a plurality of power monitors distributed in the data center coupled to the thermal modeling controller; and
the thermal modeling controller further configured to:
adjust air flow patterns based on the data center theoretical temperature profile, temperature measurements from the plurality of temperature sensors, and power measurements from the plurality of power monitors;
analyze the data center theoretical temperature profile, temperature measurements from the plurality of temperature sensors, and power measurements from the plurality of power monitors, and to determine a field replaceable unit configuration that improves thermal and power condition balance; and
execute a dynamic workload balancing action that selectively activates and deactivates selected field replaceable units based on the analysis of the data center theoretical temperature profile, temperature measurements from the plurality of temperature sensors, and power measurements from the plurality of power monitors.

9. A data center thermal management apparatus comprising:
a thermal management controller adapted to communicate with a plurality of field replaceable units, temperature sensors, and power monitors distributed in a data center, and to monitor temperature measurements from the temperature sensors, power measurements from the power monitors, and information relating to field replaceable unit thermal properties and position from the field replaceable units, the thermal management controller being further adapted to generate a theoretical temperature profile of the data center based on the monitored measurements and information;
a plurality of temperature sensors distributed in the data center coupled to the thermal modeling controller;
a plurality of power monitors distributed in the data center coupled to the thermal modeling controller; and
the thermal management controller further configured to:
adjust air flow patterns based on the data center theoretical temperature profile, temperature measurements from the plurality of temperature sensors, and power measurements from the plurality of power monitors;
analyze the data center theoretical temperature profile, temperature measurements from the plurality of temperature sensors, and power measurements from the plurality of power monitors, and to determine a field replaceable unit configuration that improves thermal and power condition balance; and
execute a dynamic workload balancing action that selectively activates and deactivates selected field replaceable units based on the analysis of the data center theoretical temperature profile, temperature measurements from the plurality of temperature sensors, and power measurements from the plurality of power monitors.

10. The apparatus according to claim 9 further comprising:
the thermal management controller further adapted to detect hot spots in the data center and generate alert messages indicative of hot spot location.

11. A data center thermal management apparatus comprising:
a thermal management controller adapted to communicate with a plurality of field replaceable units, temperature sensors, and power monitors distributed in a data center, and to monitor temperature measurements from the temperature sensors, power measurements from the power monitors, and information relating to field replaceable unit thermal properties and position from the field replaceable units, the thermal management controller being further adapted to generate a theoretical temperature profile of the data center based on the monitored measurements and information;

a radio frequency identification (RFID) tag coupled to ones of the at least one field replaceable unit;

the thermal management controller adapted to operate as at least part of a Global Positioning System (GPS), map location of the ones of the at least one field replaceable unit and generate information for real-time dynamic temperature mapping of the data center based at least partly on the mapped location; and the thermal management controller further adapted to monitor information relating to field replaceable unit thermal properties and location, generate a theoretical temperature profile of the data center, and execute a dynamic workload balancing action that selectively activates and deactivates selected field replaceable units based on the theoretical temperature profile and measurements from at least one temperature sensor and at least one power monitor in the data center.

12. A method of managing conditions in a data center comprising:

storing information relating to field replaceable unit thermal properties in at least one field replaceable unit non-volatile memory;

generating information for real-time dynamic temperature mapping of the data center based on the field replaceable unit thermal property information;

coupling a radio frequency identification (RFID) tag to ones of the at least one field replaceable unit;

mapping location of the ones of the at least one field replaceable unit using a Global Positioning System (GPS);

generating information for real-time dynamic temperature mapping of the data center based at least partly on the mapped location;

monitoring information relating to field replaceable unit thermal properties and location;

generating a theoretical temperature profile of the data center; and executing a dynamic workload balancing action that selectively activates and deactivates selected field replaceable units based on the theoretical temperature profile and measurements from at least one temperature sensor and at least one rower monitor in the data center.

13. The method according to claim 12 further comprising: storing information relating to field replaceable unit thermal properties including storing thermal parameters and/or thermal equations adapted for application to thermal sensors.

14. The method according to claim 12 further comprising: storing thermal property information in the at least one field replaceable unit comprising one or more properties selected from a group consisting of airflow, temperature rise across the field replaceable unit, and package size.

15. The method according to claim 12 further comprising: determining location of the ones of the at least one field replaceable unit using triangulation of radio frequency identification (RFID) tags; and generating information for real-time dynamic temperature mapping of the data center based at least partly on the determined location.

16. A method of managing conditions in a data center comprising:

monitoring temperature measurements from at least one temperature sensor distributed in the data center;

monitoring power measurements from the at least one power monitor distributed in the data center;

acquiring information relating to field replaceable unit thermal properties and position from at least one field replaceable unit distributed in the data center;

generating a theoretical temperature profile of the data center based on the monitored measurements and read information;

adjusting air flow patterns based on the data center theoretical temperature profile, temperature measurements, and power measurements;

analyzing the data center theoretical temperature profile, temperature measurements, and power measurements;

determining a field replaceable unit configuration that improves thermal and power condition balance based on the analysis; and balancing dynamic workload comprising selectively activating and deactivating selected field replaceable units based on the analysis of the data center theoretical temperature profile, temperature measurements, and power measurements.

17. The method according to claim 16 further comprising: detecting hot spots in the data center; and generating alert messages indicative of hot spot location in relation to location of the field replaceable unit plurality.

18. A thermal control apparatus for usage in a data center comprising:

means for storing information relating to field replaceable unit thermal properties in at least one field replaceable unit non-volatile memory;

means for generating information for real-time dynamic temperature mapping of the data center based on the field replaceable unit thermal property information;

means for monitoring temperature measurements from at least one temperature sensor distributed in the data center;

means for monitoring power measurements from the at least one power monitor distributed in the data center;

means for acquiring information relating to field replaceable unit thermal properties and position from at least one field replaceable unit distributed in the data center; and means for generating a theoretical temperature profile of the data center based on the monitored measurements and read information;

a radio frequency identification (RFID) tag coupled to ones of the at least one field replaceable unit;

means for mapping location of the ones of the at least one field replaceable unit using a Global Positioning System (GPS); and means for generating information for real-time dynamic temperature mapping of the data center based at least partly on the mapped location;

means for monitoring information relating to field replaceable unit thermal properties and location;

means for generating a theoretical temperature profile of the data center; and means for executing a dynamic workload balancing action that selectively activates and deactivates selected field replaceable units based on the theoretical temperature profile and measurements from at least one temperature sensor and at least one rower monitor in the data center.

* * * * *

UNITED STATES PATENT AND TRADEMARK OFFICE
CERTIFICATE OF CORRECTION

PATENT NO. : 7,726,144 B2
APPLICATION NO. : 11/259289
DATED : June 1, 2010
INVENTOR(S) : Thane M. Larson et al.

Page 1 of 1

It is certified that error appears in the above-identified patent and that said Letters Patent is hereby corrected as shown below:

In column 19, line 44, in Claim 12, delete "rower" and insert -- power --, therefor.

In column 20, line 63, in Claim 18, delete "rower" and insert -- power --, therefor.

Signed and Sealed this
Thirty-first Day of May, 2011

David J. Kappos
*Director of the United States Patent and Trademark Office*